(12) United States Patent
Desai et al.

(10) Patent No.: US 7,675,698 B2
(45) Date of Patent: Mar. 9, 2010

(54) FIBROUS MICRO-COMPOSITE MATERIAL

(75) Inventors: Shahyaan Desai, Stoney Brook, NY (US); Michael O. Thompson, Ithaca, NY (US); Anil N. Netrvali, Ithaca, NY (US); S. Leigh Phoenix, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 415 days.

(21) Appl. No.: 11/500,011

(22) Filed: Aug. 7, 2006

(65) Prior Publication Data

US 2006/0268384 A1 Nov. 30, 2006

Related U.S. Application Data

(63) Continuation of application No. 10/395,008, filed on Mar. 21, 2003, now Pat. No. 7,405,854.

(60) Provisional application No. 60/366,454, filed on Mar. 21, 2002.

(51) Int. Cl.
*G02B 7/00* (2006.01)

(52) U.S. Cl. .............. 359/896; 359/198.1; 359/224.1; 310/300

(58) Field of Classification Search ............... None
See application file for complete search history.

(56) References Cited

U.S. PATENT DOCUMENTS

| 6,445,006 | B1* | 9/2002 | Brandes et al. | ............... 257/76 |
|---|---|---|---|---|
| 6,516,208 | B1 | 2/2003 | Eden | |
| 6,668,108 | B1 | 12/2003 | Helkey et al. | |
| 7,003,188 | B2 | 2/2006 | Hsu et al. | |
| 7,405,854 | B2 | 7/2008 | Desai et al. | |
| 2001/0055462 | A1 | 12/2001 | Seibel | |
| 2002/0131139 | A1 | 9/2002 | Mandella et al. | |
| 2002/0181844 | A1 | 12/2002 | Vaganov | |

(Continued)

FOREIGN PATENT DOCUMENTS

EP 0875780 A2 11/1998

(Continued)

OTHER PUBLICATIONS

Lin, Hung-Yi , et al., "Rib-reinforced micromachined beam and its applications", *Journal of Micromechanics and Microengeering*, 10(1), 2000,93-99.

(Continued)

*Primary Examiner*—James Phan
(74) *Attorney, Agent, or Firm*—Schwegman, Lundberg, & Woessner, P.A.

(57) ABSTRACT

Fibrous micro-composite materials are formed from micro fibers. The fibrous micro-composite materials are utilized as the basis for a new class of MEMS. In addition to simple fiber composites and microlaminates, fibrous hollow and/or solid braids, can be used in structures where motion and restoring forces result from deflections involving torsion, plate bending and tensioned string or membrane motion. In one embodiment, fibrous elements are formed using high strength, micron and smaller scale fibers, such as carbon/graphite fibers, carbon nanotubes, fibrous single or multi-ply graphene sheets, or other materials having similar structural configurations. Cantilever beams and torsional elements are formed from the micro-composite materials in some embodiments.

5 Claims, 11 Drawing Sheets

U.S. PATENT DOCUMENTS

2004/0082247 A1 4/2004 Desai et al.
2006/0007514 A1 1/2006 Desai

FOREIGN PATENT DOCUMENTS

WO WO-2006002388 A1 1/2006

OTHER PUBLICATIONS

Netravali, A., et al., "F04-CR02 Fibrous Micro-electro-mechanical-system (MEMS)", *National Textile Centre Annual Report*, 2004, (Nov. 2004),1-4.

Rajic, S., et al., "Novel fabrication and simple hybridization of exotic material MEMS", *Proceedings of the Spie—The International Society for Optical Engineering, 3874*, (1999),188-194.

Siebel, E. J., et al., "Optical Fiber Scanning as a Microdisplay Source for a Wearable Low Vision Aid", *SID Symposium Digest of Technical Papers*, 33(1), (May 2002),4 pgs.

Ting, J-M., et al., "Formation of Nodulated Vapor Grown Carbon Fiber", *Carbon*, 38(14), (2000),1917-1923.

"U.S. Appl. No. 10/395,008, Advisory Action Apr. 22, 2008", 3 pgs.

"U.S. Appl. No. 10/395,008, Advisory Action mailed Mar. 26, 2008", 3 pgs.

"U.S. Appl. No. 10/395,008, Advisory Action mailed Jun. 20, 2006", 3 pgs.

"U.S. Appl. No. 10/395,008, Amendment and Response filed Feb. 5, 2007 to Non-Final Office Action mailed Oct. 5, 2006", 20 pgs.

"U.S. Appl. No. 10/395,008, Amendment and Response filed Mar. 30, 2005 to Non-Final Office Action mailed Dec. 30, 2004", 18 pgs.

"U.S. Appl. No. 10/395,008, Amendment and Response filed Mar. 9, 2006 to Final Office Action mailed Feb. 9, 2006", 15 pgs.

"U.S. Appl. No. 10/395,008, Final Office Action mailed Feb. 9, 2006", 6 pgs.

"U.S. Appl. No. 10/395,008, Interview Summary mailed May 5, 2008", 4 pgs.

"U.S. Appl. No. 10/395,008, Non-Final Office Action mailed Oct. 5, 2006", 7 pgs.

"U.S. Appl. No. 10/395,008, Non-Final Office Action mailed Dec. 30, 2004", 7 pgs.

"U.S. Appl. No. 10/395,008, Notice of Non-Compliant Amendment mailed Aug. 9, 2007", 3 pgs.

"U.S. Appl. No. 10/395,008, Office Communication mailed May 2, 2007", 2 pgs.

"U.S. Appl. No. 10/395,008, Second Substitute Amendment and Response filed Sep. 6, 2007 to Notice of Non-Compliant Amendment mailed Aug. 9, 2007", 20 pgs.

"U.S. Appl. No. 10/395,008, Substitute Amendment and Response filed May 31, 2007 to Office Communication mailed May 2, 2007 and Office Action mailed Oct. 5, 2006", 20 pgs.

"U.S. Appl. No. 10/395,008, Amendment and Response filed Mar. 6, 2008 to Final Office Action mailed Dec. 6, 2007", 17 pgs.

"U.S. Appl. No. 10/395,008, Supplemental Amendment and Response filed Apr. 3, 2008 to Final Office Action/Advisory Action mailed Dec. 6, 2007", 18 pgs.

"U.S. Appl. No. 10/395,008, Second Supplemental Amendment and Response filed Apr. 30, 2008 to Advisory Action mailed Apr. 22, 2008", 16 pgs.

"U.S. Appl. No. 10/395,008, Final Office Action Mailed Dec. 6, 2007", 12 pgs.

"U.S. Appl. No. 11/166,363, Non-Final Office Action mailed Jan. 10, 2008", 7 pgs.

"U.S. Appl. No. 11/166,363, Non-Final Office Action mailed May 1, 2007", 9 pgs.

"U.S. Appl. No. 11/166,363, Final Office Action mailed Oct. 18, 2007", 7 pgs.

"U.S. Appl. No. 11/166,363, Amendment and Response filed Dec. 18, 2007 to Final Office Action mailed Oct. 18, 2007", 8 pgs.

"U.S. Appl. No. 11/166,363, Amendment and Response filed Aug. 1, 2007 to Non-Final Office Action mailed May 1, 2007", 10 pgs.

"U.S. Appl. No. 11/166,363, Amendment and Response filed Apr. 9, 2008 to Office Action mailed Jan. 10, 2008", 8 pgs.

"U.S. Appl. No. 10/395,008 Notice of Allowance mailed May 21, 2008", NOAR, 11pgs.

\* cited by examiner

FIBROUS MICRO-COMPOSITE MATERIAL

RELATED APPLICATIONS

This application is a continuation of U.S. patent application Ser. No. 10/395,008, filed Mar. 21, 2003, now U.S. Pat. No. 7,405,854, which claims priority to U.S. Provisional patent application Ser. No. 60/366,454, filed Mar. 21, 2002, which is incorporated herein by reference.

FIELD OF THE INVENTION

The present invention relates to composite materials, and in particular to fibrous micro-composite materials

BACKGROUND OF THE INVENTION

Present day micro-electro-mechanical systems (MEMS) based actuator devices have fundamental performance issues that severely limit their widespread commercialization. Although MEMS manufacturers have pushed to develop silicon and other material-based structures, the resulting systems still lack the needed mechanical properties. A specific example is the case of MEMS based optical scanner and switches (OMEMS). Such devices need to produce large angular deflections (several tens of degrees) and resonant frequencies exceeding tens of kilohertz with lifetime reliability over billions of cycles.

Monolithic materials, such as silicon, metal and ceramic thin films currently used to produce MEMS lack the required combination of high elastic stiffness, high strength, high fatigue lifetime and low density (mass per unit volume) i.e., the basic mechanical flexibility and flaw tolerance necessary for many potential MEMS applications. Polymers, are not adequate since they are too flexible and have low strength which limits them to low frequency operation in devices where low forces and/or displacements are required, such as valves and fluidic pumps.

Consequently, moving component MEMS, such as optical scanners, are nearly non-existent commercially today. Most successful applications of MEMS remain based on quasi-static devices such as pressure and acceleration sensors. One moving component MEMS is a digital light processor that is based on bistable positioning of aluminum MEMS mirrors.

The need for advanced capability MEMS devices can be illustrated through a particular application—the MEMS based optical scanner (an OMEMS). Such scanners are envisioned for large area display applications using three-color scanning. Early MEMS optical scanners utilized a torsional silicon micro-mirror produced using wet etching. It was capable of deflecting a beam through a 0.8° angle at a resonance frequency of 16.3 kHz. The majority of OMEMS scanners in development today are still designed using similar thin beams of silicon acting either as torsion bars (around which a silicon mirror element rotates) or as cantilevers (which vibrate to provide the scanning motion). Both of these structure types are efficient, with no moving parts to wear.

General applications are dependent on the resonance frequency, the maximum deflection, and the maximum restoring force—with higher values of each normally desired. These properties are dependent on the size, shape, and mechanical properties of the underlying materials. However, materials used in traditional IC-based MEMS fabrication lack the mechanical characteristics required to allow specific tailoring and optimization for many applications. There is no current way to design simultaneously for high frequency operation, large amplitude deflection, low operating power, robustness, and long-term reliability under cyclic stresses with existing material systems. The basic problem with silicon, and monolithic materials in general, is that while having sufficient elastic stiffness, their strength and fatigue lifetime is too low and density too high. This combination limits the ultimate deflection amplitude and frequency, and increases power requirements to sustain oscillation.

SUMMARY OF THE INVENTION

Fibrous micro-composite materials are formed from micro fibers. The fibrous micro-composite materials are utilized as the basis for a new class of MEMS. In addition to simple fiber composites and microlaminates, fibrous hollow and/or solid braids, can be used in structures where motion and restoring forces result from deflections involving torsion, plate bending and tensioned string or membrane motion. In some embodiments, these materials will enable simultaneous high operating frequencies, large amplitude displacements and or rotations, high reliability under cyclical stresses.

In one embodiment, fibrous elements are formed using high strength, micron and smaller scale fibers, such as carbon/graphite fibers, carbon nanotubes, fibrous single or multi-ply graphene sheets, or other materials having similar structural configurations.

In a further embodiment, cantilever beams are fabricated from single fibers, single/multilayer aligned arrays of fibers, or single/multilayer fabrics. Such fabrics exploit the special strong anisotropic mechanical properties and high strength along the fiber axis of the fibers yielding structures with high bending stiffness, and low mass, yet large bending curvatures. Single fiber cantilevers provide the highest possible operating frequencies for potential applications such as RF sensors, at the expense of lateral stiffness and strength. Multifiber cantilevers benefit from statistical improvements and stability based on averaging properties and load sharing in the event of fiber damage or intrinsic faults. The natural extension is to more complex fabrics with optimized properties in multiple directions or multiple modes of deflection. Such cantilevers can also be produced from braided torsion elements, producing both lateral and angular displacements.

In still further embodiments, plates (two dimensional minimally deformable objects) are fabricated from single/multilayer aligned arrays of fibers, or single/multilayer fabrics. This configuration optimizes the stiffness to mass ratio together with the strength required for high frequency motion, such as required for the mirror element in a scanner MEMS. Relative stiffness in the two axes may be tailored to balance driving forces through fiber density, type, orientation, positioning and/or weave characteristics.

In yet a still further embodiment, hollow or tubular microbraids made from micron-scale fibers are used as torsional deflecting elements in devices to provide high performance MEMS actuators. Braids permit the transformation of stresses within the torsion bar from shear (resulting from twisting motion) to tensile/compressive stresses (with some bending) along the orthogonal fiber axes at plus/minus 45 degrees. In effect, the braid allows the fibers to act in a mode in which their behavior is exceptional. Torsion elements at the sub 100 micron scale (comparable to MEMS device dimensions) can be fabricated from fibers 5 microns in diameter; smaller fibers produce commensurately smaller braids.

Additionally by manipulating the dimensions of the braid, the braiding angle, the types of fibers used to construct the braid, and the size and number of fibers in the braid, torsional elements with tailored strength, elastic stiffness, density, and other mechanical properties can be produced. This enhancement and tailorability of the strength and elastic stiffness of the torsional element results in MEMS devices capable of producing large angular deflections and forces at high frequenies and speeds without failure.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Fibrous micro-composite materials are formed from micro fibers. A new class of MEMS (Micro-Electro-Mechanical-System) devices is based on the fibrous micro-composite materials. Such fibrous micro-composite MEMS promise to meet the requirements of high performance applications where large deflections and forces, coupled with high operating frequency and reliability under cyclical stresses are required, and which cannot be met by silicon and other currently used MEMS materials.

MEMS devices are constructed from a single or multi-fiber structures with approximately 10 micron to sub-micron fibers, fiber braids, or fabrics. The fiber may be all of the same type (homogeneous) or of different types fabricated side-by-side or together (heterogeneous). In one embodiment, the majority of the fibers are used to control the mechanical properties of the MEMS device. A minority of fibers may be incorporated to provide other electrical, mechanical, biological, or optical functionality. These may then be used, for example, to electro-mechanically actuate the MEMS device or serve as associated control circuitry and sensing elements within the structures. The entire micro-composite is impregnated with an appropriate binder (epoxy, glass, organic binders, etc.) to constrain the fibers and provide fiber-to-fiber load transfer. The binder is referred to as a matrix. In one embodiment, the matrix is chemically compatible with the selected fibers, processing techniques, and the environment in which the MEMS device will operate.

MEMS are inherently micron-scale devices. Typical devices require a footprint of at most a few mm on an edge, and have thicknesses on the order of a few tens or hundreds of microns. High strength fibers are already commercially available in low to sub-micron diameters. These fibers can be readily oriented in any desired manner, and/or woven into fabrics that remain within the 100-200 µm range.

Figure 1:
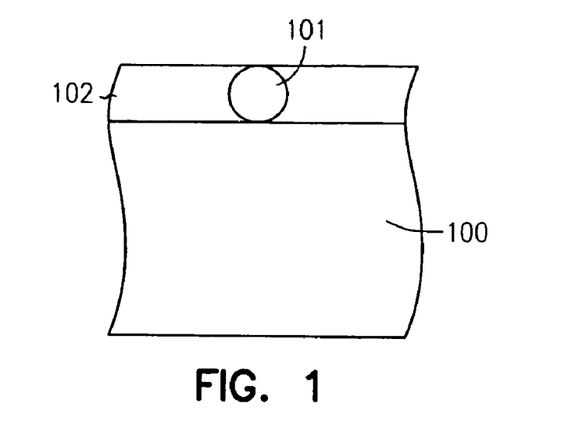
FIG. 1 is a cross section of a single micro-fiber encapsulated in a matrix supported by a substrate.

In FIG. 1, a suitable substrate 100, such as a silicon wafer is used to support a fiber 101 which is mounted in a suitable matrix 102. The single fiber 101 is placed on the wafer 100 surface. The matrix 102 encapsulates the fiber on the wafer surface. It is formed by spin coating or any other suitable method such as one that is compatible with processes common to MEMS and semiconductor fabrication. The spin coating forms a film encapsulating the fiber on the wafer surface that is then cured thermally, or by using light or other radiation to form a composite film.

Figure 2:
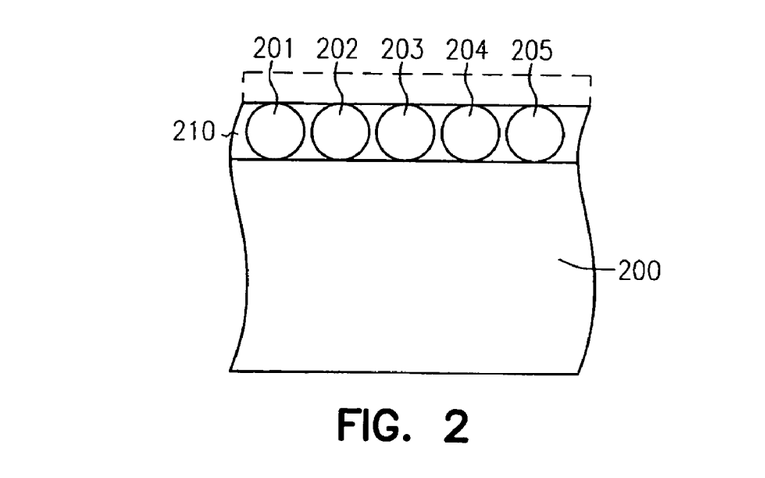
FIG. 2 is a cross section of a collection of parallel aligned fibers encapsulated in a matrix supported by a substrate.

In FIG. 2, a substrate 200 is shown supporting multiple fibers, 201, 202, 203, 204 and 205 laid out substantially parallel and adjacent to each other. A matrix 210 encapsulates the fibers to provide a single layer array of fibers.

Carbon/graphite fibers are the strongest material currently available for forming fibrous based fabrics and braids, and are extremely fatigue resistant in tension and compression even at high stress levels. Fiber material tensile strengths in excess of 20 GPa have been seen in bending loop tests. Additionally, fiber strength is size dependent, increasing when fiber lengths decrease to sub millimeter levels or when fiber diameter continually decreases below 10 microns. Micro-fibers also vary between 2 cm to sub mm in length in one embodiment. Longer fibers may also be used.

Graphite fiber which has a mean tensile strength of 5 GPa at a 2 cm length scale can have a tensile strength of 10 GPa at sub mm length scales and this can be "guaranteed" by selection through proof-testing. Thus, graphite fibers can be selected to have failure strains consistently above 5%. This is especially possible with the latest generation of graphite fibers reportedly with strengths at several cm gage lengths of 8 GPa so this should scale to 15 GPa at sub mm dimensions.

Graphite fibers exhibit the highest flaw tolerance of any material. The stacked and folded graphene "sheet" nature of graphite fibers isolates the interior core from flaws on the outer surface of the fibers; fibers shed outer sheaths without failure of the entire fiber. Fibers also tend to increase their strength as the size is reduced—for carbon fibers, the highest failure stresses (>15 GPa) are observed in 4-5 µm fibers. In a further embodiment, it is desired that the fibers are comprised of multiple parallel carbon nanotubes. Once available, such fibers will allow the use of nanotubes in fiber bundles on the micrometer to millimeter scale.

To ensure this high strength of fibers within the braid, 2-5 µm Torayca T1000 carbon fibers which have stated strengths of approximately 1.2 Msi (~8.3 GPa) at 2 to 3 cm gage lengths are used in one embodiment. Only carbon fibers that have been proof tested at over 5% strains are used to make braids in one embodiment. Of course, other fibers may also be used with varying results.

Figure 3:
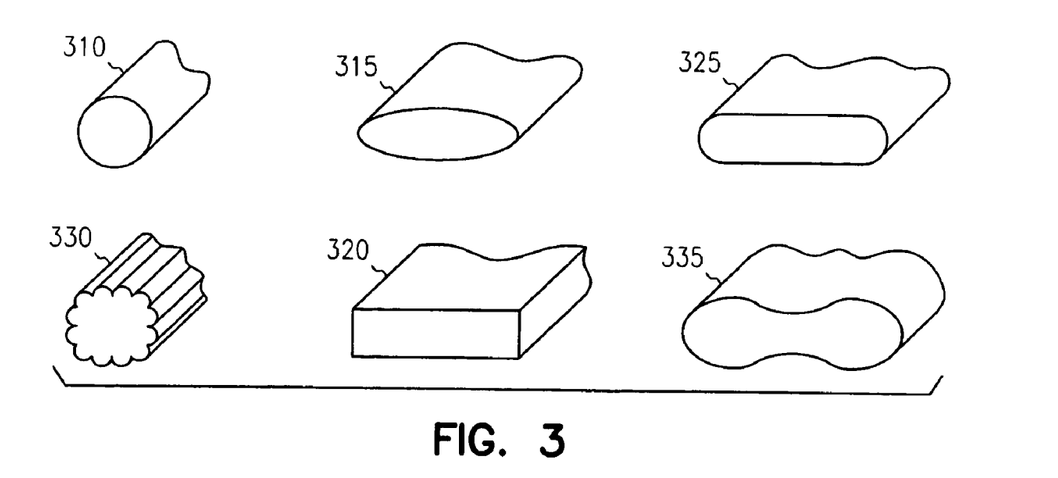
FIG. 3 is a perspective view of multiple variations of micro-fiber cross sections.

Multiple different cross sections of fibers are shown in FIG. 3. A typical round cross section fiber is indicated at 310. An elliptical fiber cross section is shown at 315. A rectangular fiber cross section is shown at 320. At 325, a fiber cross section that is fairly rectangular, but with rounded edges is shown. A grooved fiber cross section is shown at 330, and a dogbone type cross section fiber is shown at 335. Each of these fibers may be used to create fibrous micro-composite structures.

The matrix choice is important to achieving the desired mechanical properties of the micro-composite. In one embodiment, the matrix is durable enough to survive a large number of deformation cycles, wherein it reliably transfers the load across filaments in the composite. It also adheres strongly to outer packaging structures of the device, and serves as an efficient load transfer medium at the fiber terminations. It may also be compatible with deposition, etching etc., techniques and processes used in making MEMS devices.

Electro-active polymers may be utilized for the matrix. Piezoelectric polymers may also be used as part of the matrix. Blends of different materials may be used as matrices to obtain tailored electromechanical properties.

Methods to enhance fiber/matrix bonding, well known to a person experienced in the art, can be similarly utilized in these structures. For example, matrix load-transfer characteristics may be modified by adjusting the sizing applied to different fibers. Requirements in the mirror, frame, and flexure elements of MEMS scanners are different and significant alterations in surface treatments may be advantageous.

In addition to fibers that act as enhance the mechanical properties of the MEMS fibers of electro-chemically/mehcanically/optically/biologically functional materials may also be incorporated into said MEMS structures and deevices to act as actuating and or sensing elements. For example, magnetic actuation is known to generate, at low power, the high forces required for high speed and deflection. The strength of the interaction depends on the total volume of magnetic material that can be incorporated into the MEMS structure. Traditionally, these are electroplated onto structures of the MEMS device. In the case of fabrics, fibers of ferromagnetic material, are woven directly into the fabric, integrating the actuation directly into the overall fabric. Additionally, incorporating other types of fibers into the weave and creating a hybrid fibrous structure can also create MEMS devices with integrated sensor elements.

Figure 4:
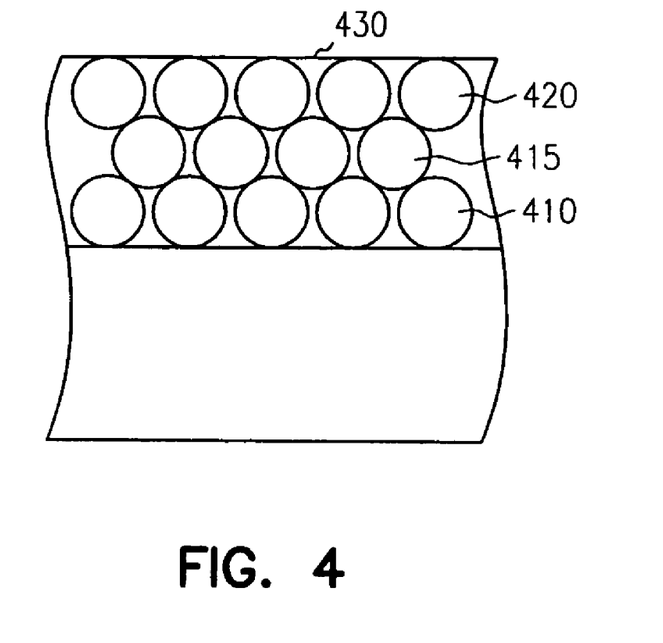
FIG. 4 is a cross section view of a collection of multiple layers of parallel aligned fibers encapsulated in a matrix supported by a substrate.

The MEMS structures can also be made by layering arrays of oriented fibers 410, 415 and 420 in FIG. 4 in different configurations. Such arrays are impregnated with an appropriate matrix 430 and converted into a stiff composite. Or, by weaving filaments into a fabric. A fabric base provides advantages over laminated unidirectional fiber arrays since the fiber interlacing points provide additional stiffness and better transverse properties that help maintain mirror flatness during operation. Alignment of the fabric to specific elements or structures within the MEMS is also simpler. The weave of the fabric (plain, twill, satin, double, etc.) may be selected based on the desired stiffness of the mirror element. In this composite, the matrix serves primarily as load transfer between the fibers at low shear stresses and strains; though in the braid it will also serve to maintain mechanical stability. A wide range of matrices may be used and selected to achieve the desired stiffness. This fabric-based (fibrous) composite, bonded to conventional silicon substrates, forms a base for the optical scanner, and potentially for a wide variety of other MEMS structures.

The fibers, matrix, weave and braid characteristic can each be independently optimized to achieve specific requirements. The fiber type, alignment/orientation, weave, and fiber volume fraction determine the tensile and fracture strengths of micro-composites, as well as their elastic stiffness. The stiffness of torsion elements formed from the micro-composites is dominated by the fiber axial stiffness in combination with curvatures associated with the braid characteristics, and to a much lesser extent the matrix modulus and the adhesion between the fibers in the braid and the matrix. The fibers in the braids and fabric should be well adhered. Individual matrix areas may also be modified separately, using localized cross-linking techniques, to achieve optimal mechanical properties within a MEMS device such as a scanner.

In this composite, the matrix serves primarily as load transfer between the fibers A wide range of matrix material can be selected to achieve the desired behavior from the fibrous composite MEMS. This fabric-based (fibrous) composite, bonded to conventional silicon substrates, forms a base for the optical scanner, and potentially for a wide variety of other MEMS structures.

Figure 5:
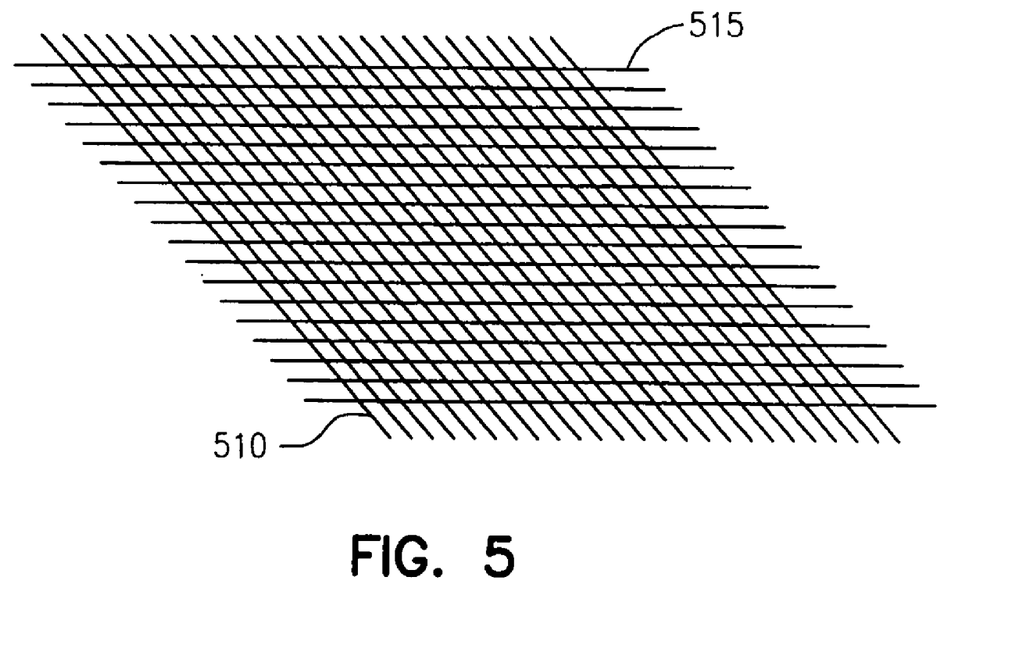
FIG. 5 is a perspective schematic view of layers of bidirectional micro-fibers.

In FIG. 5, adjacent layers of fibers are shown in a non-weaved pattern. A first layer 510 is comprised of a group of parallel adjacent fibers arranged in one plane, with an adjacent second layer 515 of a group of parallel adjacent fibers arranged in a plane parallel to the first layer 510. In one embodiment, the fibers in the two layers are substantially orthogonal to each other. The actual angle formed between the fibers of the two layers may be significantly varied from orthogonal to parallel as desired. Still further layers may be added with the fibers arranged in the same manner or different manners, such as various weave patterns.

Figure 6:
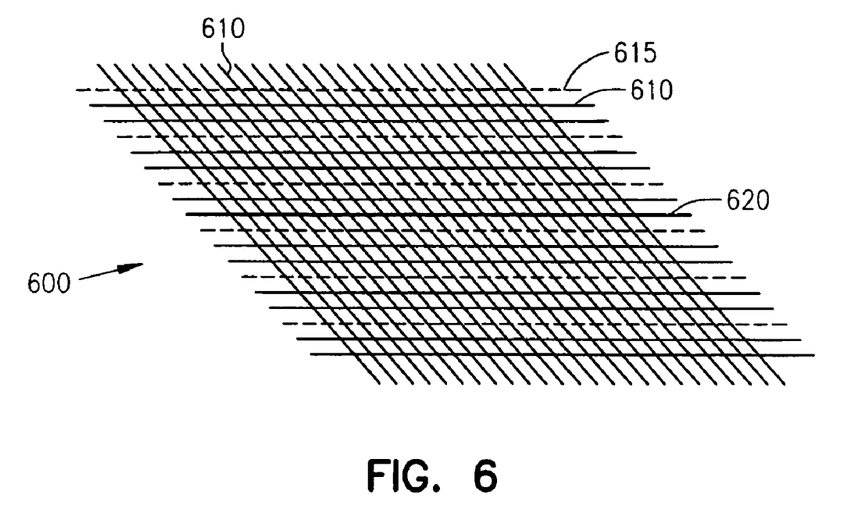
FIG. 6 is a perspective schematic view of a micro-fiber weaved fabric having a braid therein.

A variety of weaving and braiding patterns are possible to obtain the necessary mechanical properties for the mirror and frame elements. A plain weave as shown in FIG. 6 has the advantage of the highest interlacing density, yielding a stiff composite for the mirror element and frame. In FIG. 6, the woven fabric itself is a micro-composite constructed from several, micron to sub-micron scale, fibers, as shown at 600. The majority of the fibers (indicated by solid lines 610) are chosen to control the stiffness and strength (i.e. graphite, glass, nicalon) of the fabric, while some, such as a minor fraction of the fibers (indicated by dotted line 615) are ferromagnetic (i.e. nickel or Permalloy) to couple to a solenoid for actuation. Torsion bars may also be formed of a fiber braid 220 and integrated into the weave.

A satin weave has the least interlacing density, but permits a much greater fiber/yarn density in the fabric, increasing the fiber content in the final composite. Twill weave interlacing density lies between the two and will depend on the type of the twill weave. Different weave patterns may be tested to determine those providing optimal stiffness with relatively simple fabrication and processing.

Figure 7:
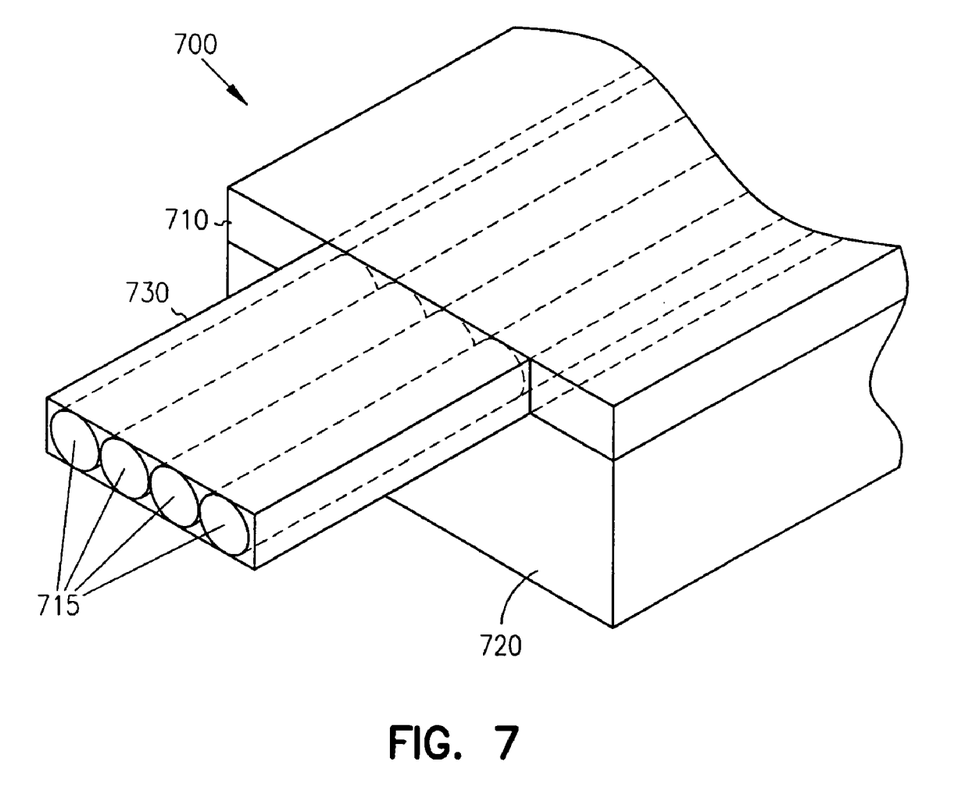
FIG. 7 is a perspective view of a multi micro-fiber cantilever supported by a substrate.

One example MEMS device utilizing such fibrous materials of the present invention is a simple oscillating multiple fiber cantilever, such as that shown in FIG. 7 at 700. In this embodiment, a matrix 710 encapsulating multiple fibers 715 is attached to a substrate 720. The fibers 715 and portion of the matrix 710 extends beyond the substrate 720 as indicated at 730. The length of the extension and properties of the fiber and matrix determine the oscillatory characteristics of the cantilever 700. Further layers may be added, such as Al or Au may formed on top of the matrix.

Figure 8:
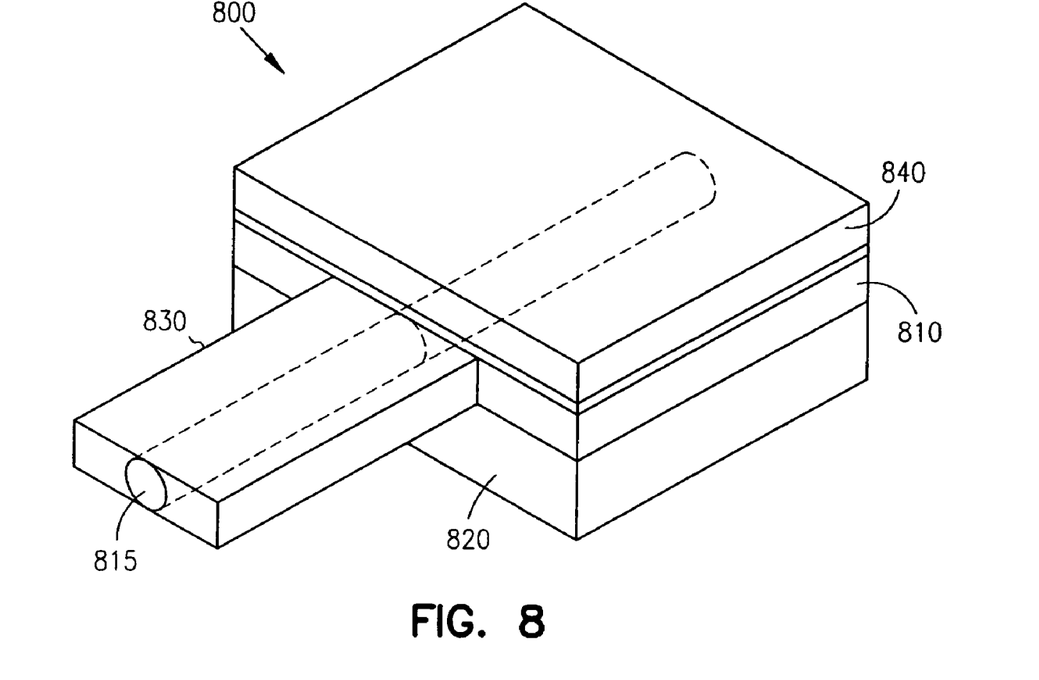
FIG. 8 is a perspective view of a single micro-fiber cantilever supported by a substrate.

One example MEMS device utilizing such fibrous materials of the present invention is a simple oscillating single fiber cantilever, such as that shown in FIG. 8 at 800. In this embodiment, a matrix 810 encapsulating a single fiber 815 is attached to a substrate 820. The fiber 815 and portion of the matrix 810 extends beyond the substrate 820 as indicated at 830. The length of the extension and properties of the fiber and matrix determine the oscillatory characteristics of the cantilever 800. In a further embodiment, a further layer 840 is formed on top of the matrix, at least in a footprint corresponding to the substrate 820. Such further material comprises Au or Al in one embodiment, and it may be coupled as by gluing, or formed in many different ways known in the semiconductor processing art.

Figure 9:
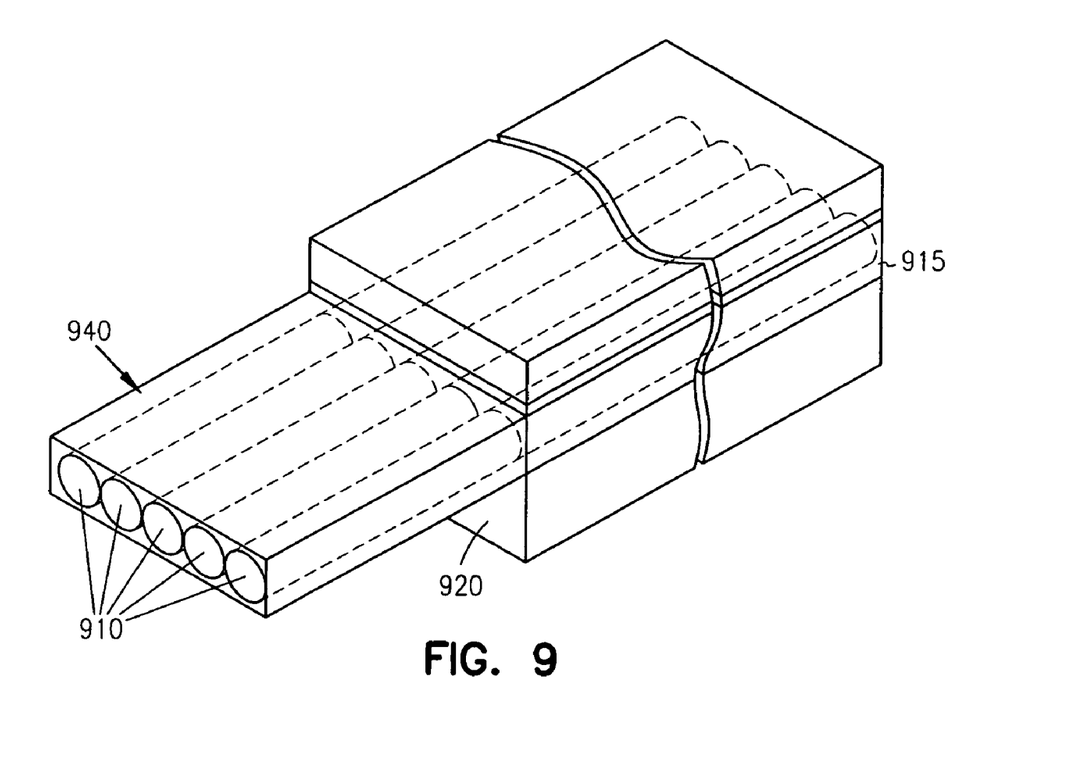
FIG. 9 is a perspective view of an alternative multi micro-fiber cantilever supported by a substrate.

In an example of a MEMS device having a multiple fiber cantilever 900 in FIG. 9, several fibers are encapsulated in a matrix 915. The matrix 915 is coupled to a substrate 920. The fibers and matrix extend from an edge of the substrate 920 as indicated at 940. The fibers 910 and matrix 915 may be cut or trimmed as desired to obtain desired characteristics.

An example method for fabricating the cantilever MEMS structure of FIG. 9 is shown in FIGS. 10A through 10L. In one embodiment single graphite fibers are extracted from bundles and placed side-by-side to form a fiber array 1001 in FIG. 10A across the surface of an oxidized 1002 silicon wafer 1003. The ends of the fiber arrays are glued to keep the fibers aligned with the substrate and with each other. The wafer with the unidirectionally aligned fiber arrays is then coated with a suitable matrix 1004 such as polyimide, by spin coating the liquid matrix material onto the substrate wafer 1003 to encapsulate the fiber array 1001. Once a desired thickness of the matrix is achieved on the substrate and the fibers are encapsulated, the matrix is cured in a furnace at 350-400 degrees C.

Figure 10A:
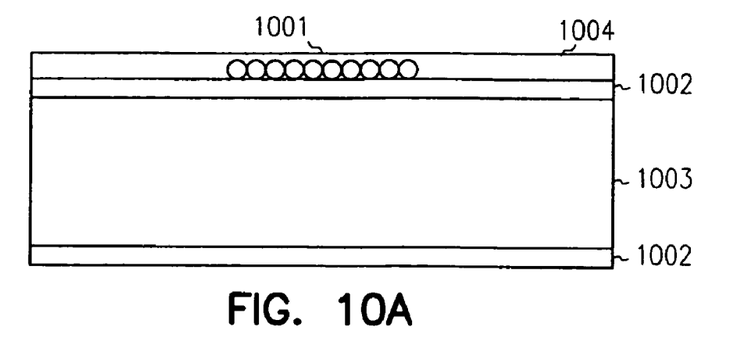
FIGS. 10A, 10B, 10C, 10D, 10E, 10F, 10G, 10H, 10I, 10J and 10K are cross section views illustrating a process of forming cantilever MEMS devices.
Figure 10B:
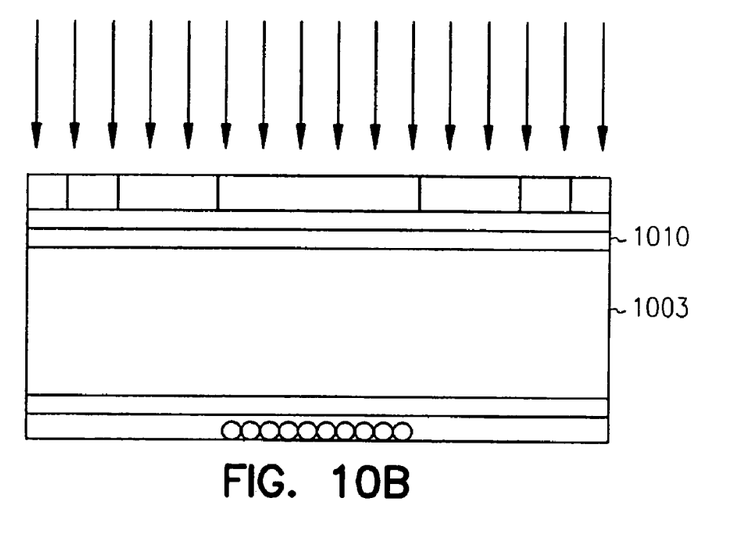
Figure 10C:
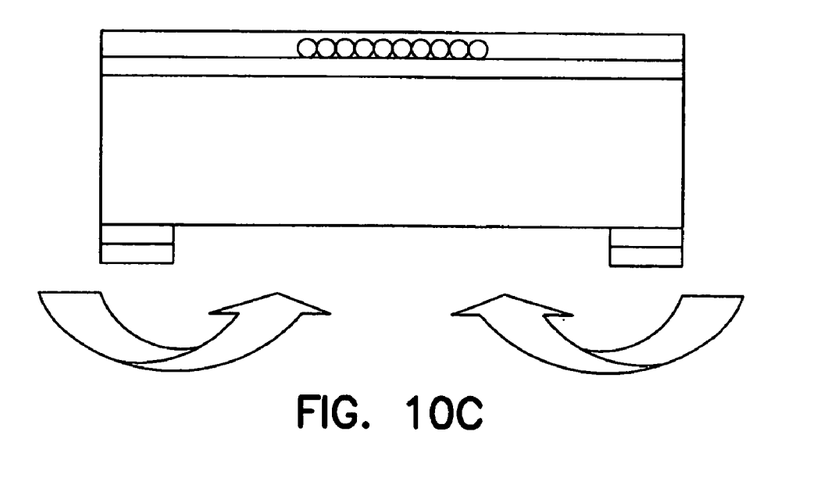
Figure 10D:
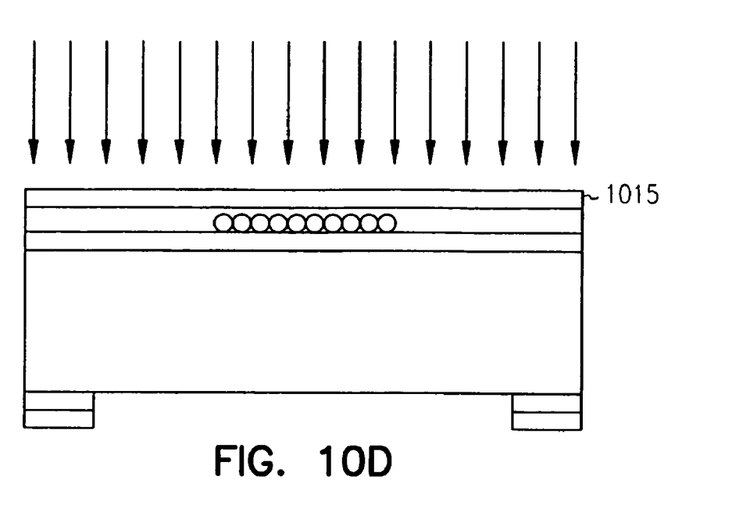
Figure 10E:
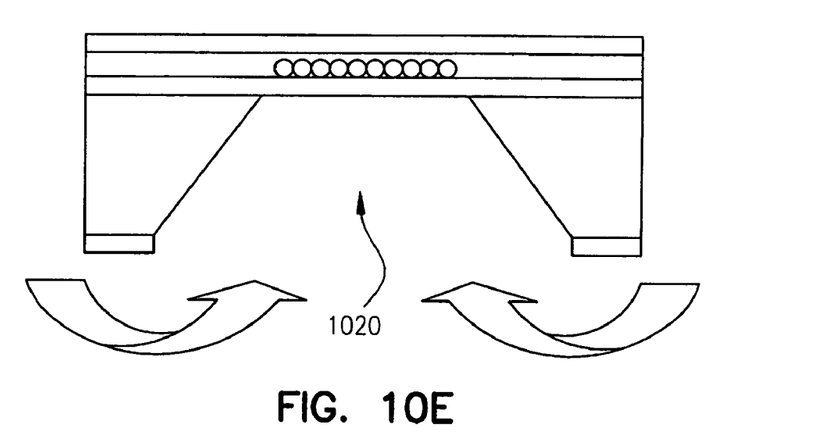
Figure 10F:
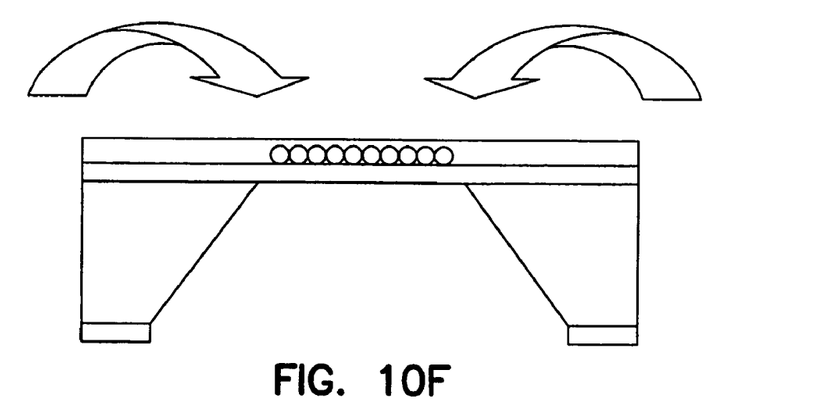

A back surface 1010 of the substrate wafer (i.e., the surface without any fiber encapsulated in polyimide) as shown in FIG. 10B is then masked for a trench etch. The mask is selectively exposed 1012 such as by UV light, and etched using wet etch chemistries common in CMOS processing. Specifically HF as seen in FIG. 10C is used to remove the oxide. Tungsten 1015 is blanket deposited to about 1000 Angstrom to protect the polyimide on the front of the substrate in FIG. 10D. KOH is used to produce trenches 1020 over which cantilever tips can freely oscillate as seen in FIG. 10E. The tungsten 1015 is then removed such as by using HF in FIG. 10F.

Figure 10G:
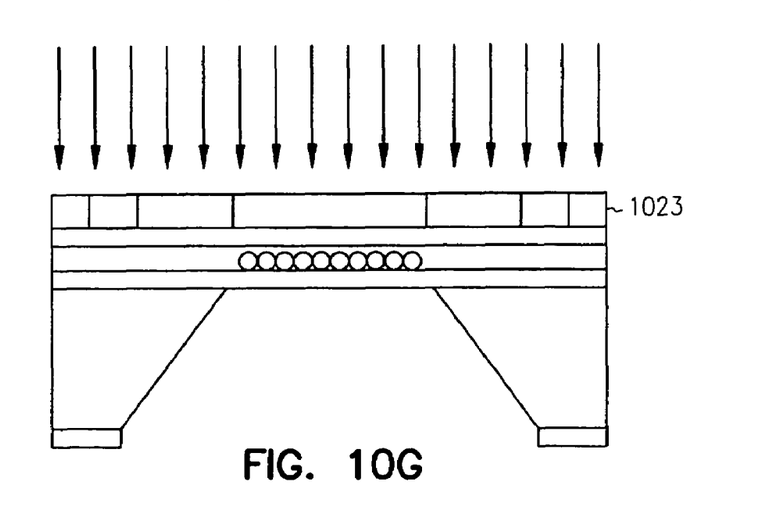
Figure 10H:
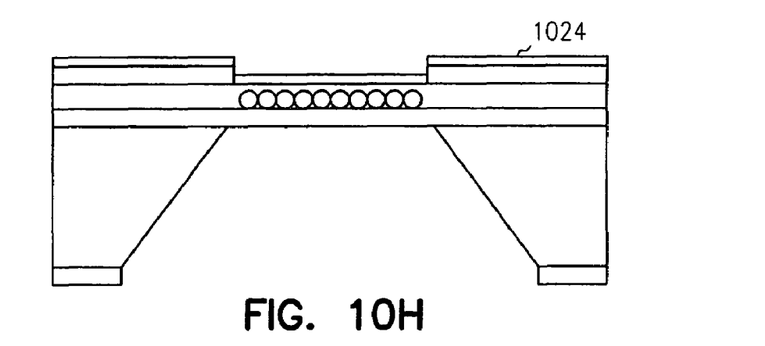
Figure 10I:
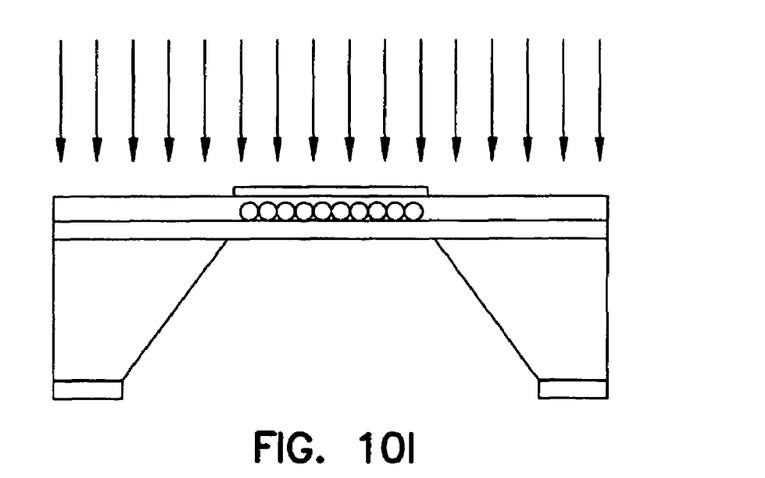
Figure 10J:
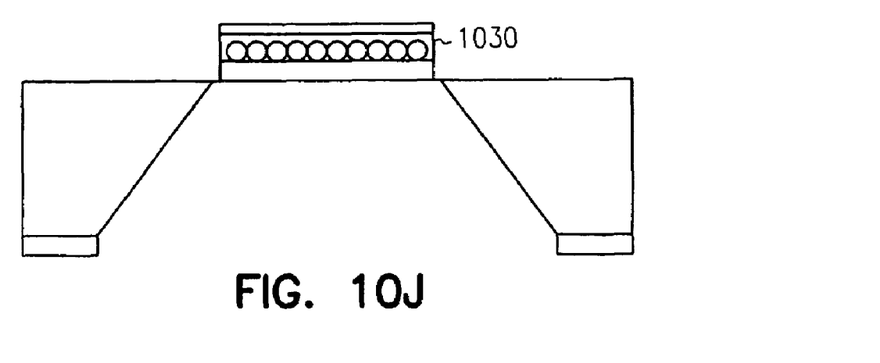
Figure 10K:
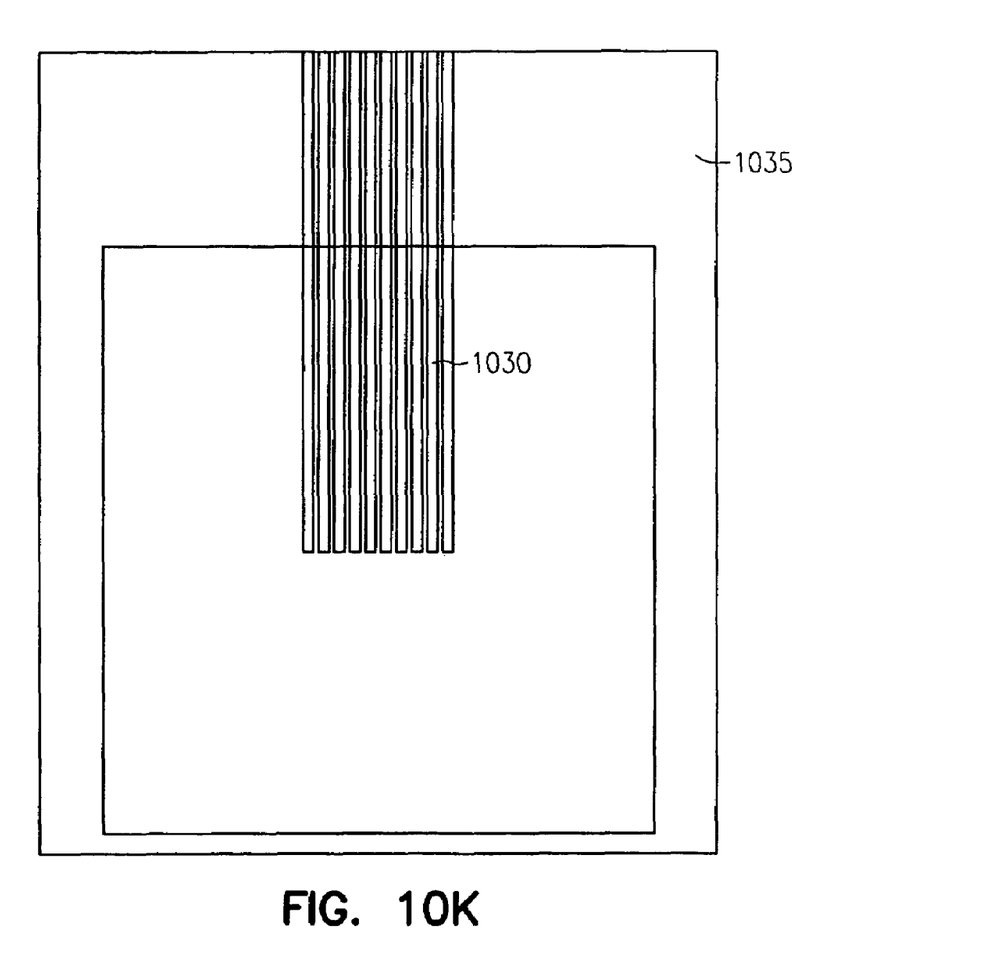

In FIG. 10G, a second mask 1023 is used to pattern cantilevers. A blanket of Al 1024 is deposited on the wafer and lifted off in areas other than the cantilevers. The wafer containing the polyimide encapsulated fibers is then exposed and etched in a $CF_4/O_2$ plasma as shown in FIG. 10I using the Al as a self-aligned mask to remove polymer and oxide. This process produces rectangular beams of polyimide encapsulated fibers 1030 that cantilever over the edges of the trenches etched into the substrate wafer from the back side as shown in side and top views of FIGS. 10J and 10K respectively. A further polyimide film 1035 may be spun on the wafer.

Figure 11:
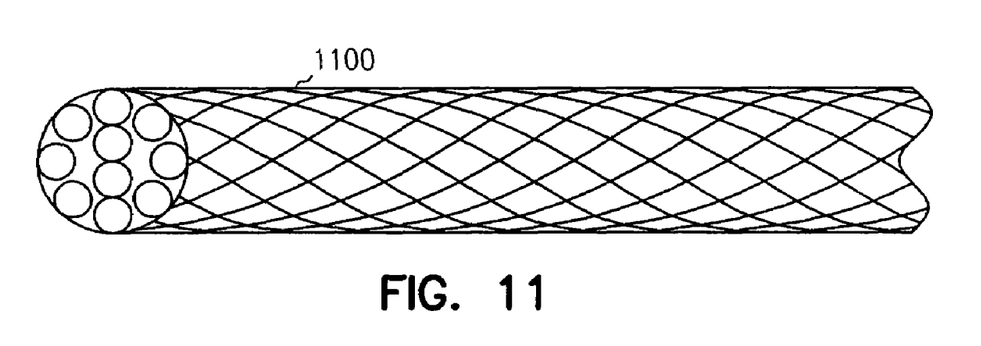
FIG. 11 is a perspective view of a solid micro-fiber braid.
Figure 12:
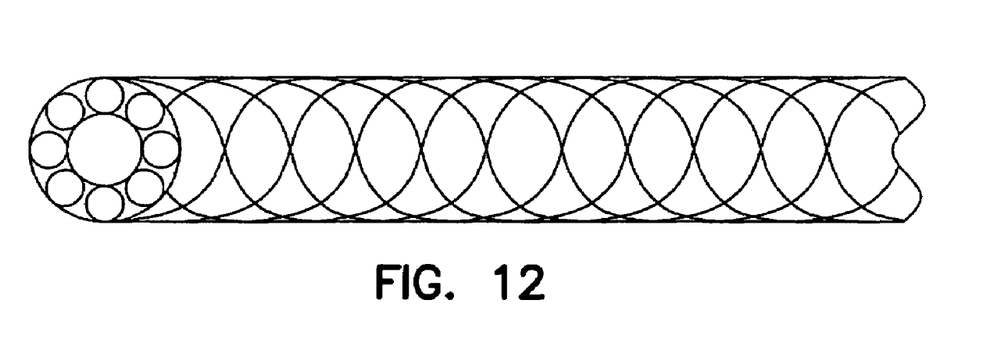
FIG. 12 is a perspective view of a hollow micro-fiber braid.
Figure 13:
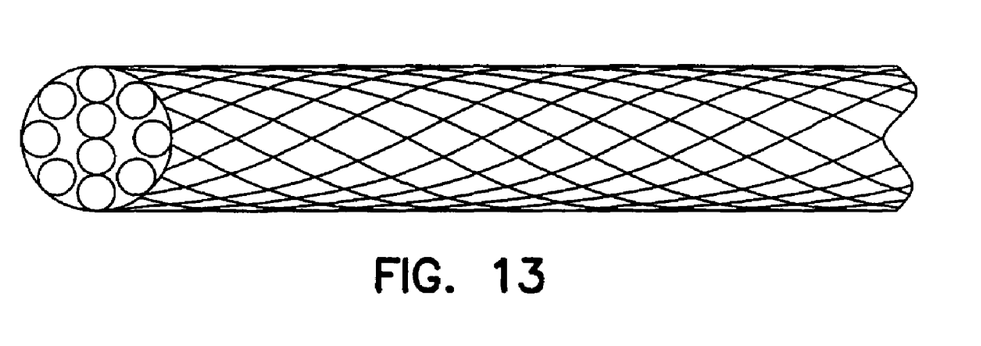
FIG. 13 is a perspective view of a solid low angle micro-fiber braid.

Several different braid structures may also be produced from the fibers as shown in FIGS. 11, 12 and 13. Braiding patterns are illustrated as single lines along the length of the braids to better illustrate such patterns. The ends of the braids illustrate a cross section of the fibers used in the braids. A solid braid 1100 comprises multiple fibers braided together in a solid structure. Each fiber is wound on a bobbin, and the process for making the braid is very similar to that used in normal textile braiding. A hollow braid 1200 comprises a ring of fibers braided with a hollow core. No bobbins are positioned in the middle, resulting in the ring of adjacent fibers with no fibers in the middle of the structure. Finally, a low angle braid 1300 is formed by adjusting the tension on the braid while the braiding process occurs.

Figure 14:
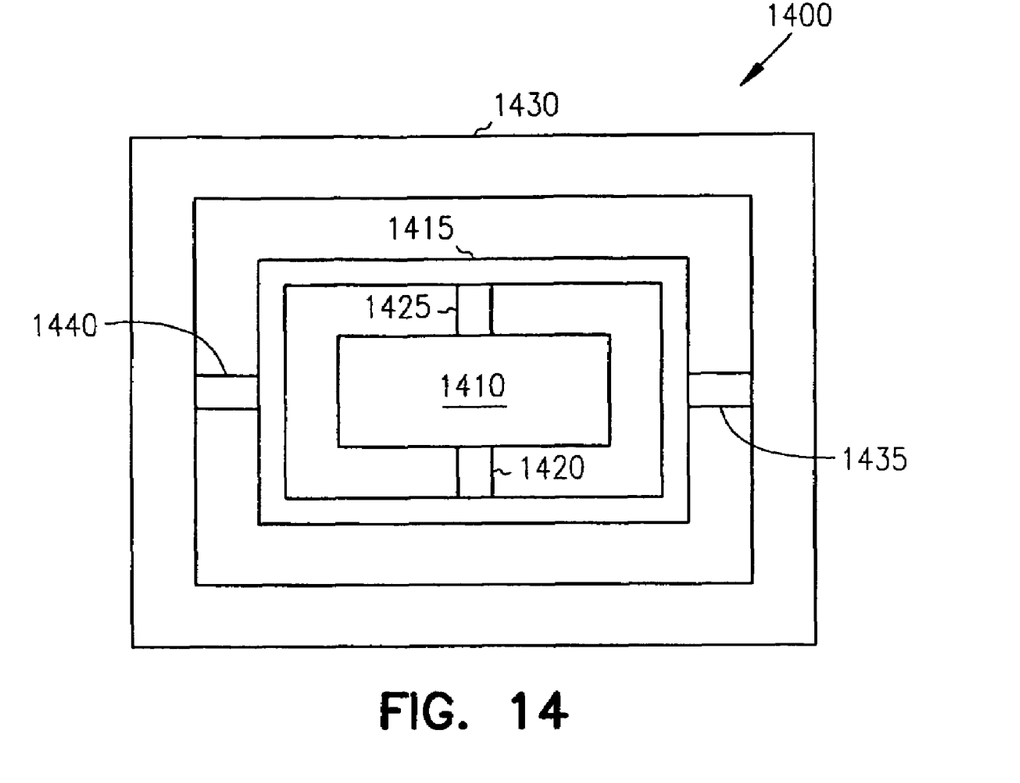
FIG. 14 is a schematic view of a scanner having nested frames and a mirror supported by orthogonal pairs of fiber braids.

Another example MEMS device utilizing such fibrous materials of the present invention is a torsional opto-mechanical scanner, such as that shown in FIG. 14 at 1400. Scanner 1400 comprises a mirror 1410 coupled to an inner frame 1415 by a pair of coaxial opposed inner torsional elements 1420 and 1425. The inner frame 1415 in turn is coupled to an outer frame 1430 by a pair of coaxial opposed outer torsional elements 1435 and 1440 which are orthogonal to the inner torsional elements. The axes of both sets of torsional elements are co-planar in one embodiment. The arrangement of frames and torsional elements allow the mirror 1410 to move about both axes of the torsional elements.

In one embodiment, the inner and outer frames 1415 and 1430 are formed using biaxial arrays of micro-fibers, the torsional elements are formed using braided fibers, and the central mirror 1410 is formed by as a woven fiber sheet such as that shown in FIG. 6. The torsion braids are hollow, and may have fibers in their cores for other purposes in various embodiments. The braids are coupled to the frames by one of many different mechanisms. In one embodiment, they are interlaced with the frames. Interlacing points between fibers in the structure provide mechanical stability.

Scanner 1400 is a staggered frame configuration where the central mirror 1410 is a plate of any desired symmetric shape, suspended by torsion elements at two opposite ends from a rectangular frame. The mirror may be coated with aluminum, chrome, copper, silver or gold in varying embodiments. The frame in turn is also suspended from a substrate by torsion elements on opposite sides, however these elements lie orthogonal but in the same plane to those suspending the mirror element. Angular deformation of the torsion elements along their axes produces corresponding rotation of the central mirror plate along two orthogonal but coplanar axes.

In one embodiment, carbon/graphite fiber micro-braids serve as the torsional elements. Unlike MEMS scanners based on silicon and related materials, the torsional elements use graphite fibers braided or double-coiled into helical structures. Such structures transform the stresses within the torsional elements from shear into tension or compression along individual fibers. Since such fibers are typically an order of magnitude stronger under tensile or compressive stresses as compared to shear stresses, these torsional elements can be made significantly stronger, lighter, and with tailorable stiffness, than any currently used monolithic material. Additionally, properties of the torsion element can be also tailored through the dimensions of the braid, and the braiding angle, the types of fibers used to construct the braid. These enhancements and tailorability of the strength, stiffness and density result in MEMS scanner devices capable of undergoing much larger angular deflections at very high resonance frequencies without failure for an extended number of cycles. This results in scanners that can be adapted or tailored to meet specific scanning or optical switching applications.

In addition to the use of micro-braids as the torsional elements, the rest of the scanner device i.e., the frames 1415 and 1430 and mirror plate 1410 may also be composed of arrays of fibers, either as aligned arrays or fabrics. A fabric base is used in one embodiment as opposed to random or aligned fiber arrays since fiber interlacing points in a fabric make delamination difficult, resulting in better mechanical properties. Additionally, the micro-braids can be interlaced into fabrics easily facilitating fabrication and construction of the device.

Alignment of the fibers and braids within specific MEMS structures is also easier with a fabric. In addition to the microbraids in the torsional elements, the woven fabric serves to enhance the mechanical properties of those structures in devices, such as the central mirror plate and surrounding frame element that face significant deformation due to inertial forces resulting from high frequency resonant operation. Deformation of the central mirror element results in inconsistent optical scans, and deformation of the frame element in addition to the mirror plate can cause the MEMS scanner to oscillate in modes other than the preferred mode of operation. A fabric base stiffens these elements to minimize deformation during dynamic operation due to inertial effects, while keeping the mass of these structures at a minimum. Simply altering the weave, fiber types, and amount and type of matrix impregnation in a fabric creates devices with different properties in different structures.

Given the above properties, single fine diameter fibers making up the individual helices in the braid are capable of consistently undergoing bend radii of as little as 10 times their own diameters. Note that tensile stress level in the fiber walls is inversely proportional to bend radius. In fabricating the torsional elements, the initial fiber configurations will have local radii several times larger than they are ultimately capable of, which means that the bending stresses will be far below the threshold for their failure. This allows the creation of dynamic/moving MEMS devices that use torsional deflection (twisting motions) to produce movement with exceptional torsional performance (by several times) compared to what is possible using existing MEMS materials.

In one embodiment torsional elements, are only a single braid consisting of only a few tens of fibers. In other embodiments, multiple layer braids may be used.

The torsional strength and stiffness of tubular braids is affected by the helix angle (i.e., the angle at which individual coils are wrapped around to form a braid), and crimp angle (i.e., the angle formed at fiber cross-over points.) Additionally other factors such as the number and diameter of the fibers making up the braid, the number of cross over points formed by the fibers, spacing between individual coils, and braid diameter and length, along with the amount and type of impregnation in the braid also affect the braid's strength and stiffness in tension.

Large diameter (100 µm) braids made with fine diameter (2-6 µm) fibers coiled at low helix angles, and with few cross over points between fibers, and modest spacing between the coils, results in braids in which the fibers are initially stressed to a fraction of their capabilities—that is bend radii of about 4 to 5 times the fiber diameter. For example for a 100 µm diameter ($R_o$) braid made of 5 µm diameter fibers coiled at a helix angle ($\alpha_0$) of 45° the curvature of the fiber in the unstrained braid is given by:

$$k = \frac{\sin^2\alpha_0}{R_0} = \frac{(1.414)^2}{100\,\mu m} = \frac{1}{50}$$

In further embodiments, anchoring is performed by splaying the fibers (beyond the flexure region) into a broad fan, which are then embedded into the mirror and frame structures. By expanding the braid in these regions, the anchoring is increased by a factor essentially equal to the number of fibers in the fan. This solution may complicate the fabrication of devices in a microprocessing flow, but can be achieved for at least small numbers of elements.

The majority of the fibers in the scanner 1400 (indicated by solid lines 610) in FIG. 6 are chosen to control the stiffness and strength of the fabric, while some, such as a minor fraction of the fibers (indicated by dotted line 615) are electromechanically functional for actuation and or sensing. For example they may be ferromagnetic nickel or permalloy fibers that couple to a solenoid and cause the entire element to move due to the magentic interaction. For each scanner 1400, the weave incorporates a single small diameter graphite fiber braid 620 serving as the torsion bars.

Figure 15:
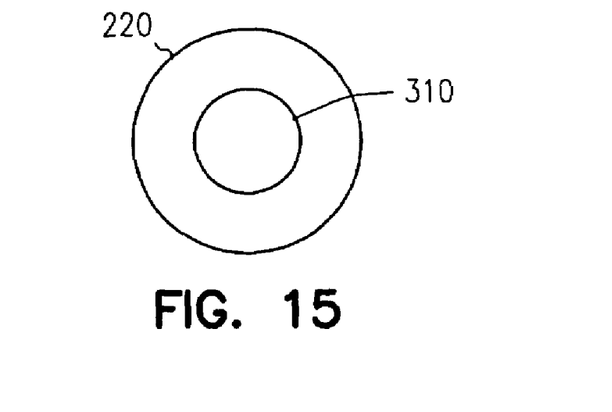
FIG. 15 is a cross section of a braid having a piezoelectric core.

In the embodiment where magnetic actuation is used to oscillate the scanner device, the density of permalloy fibers incorporated within the structures is directly coupled to the strength of the solenoid actuators. The strength of the interaction depends on the total volume of magnetic material that can be incorporated into the MEMS structure. Traditionally, these are electroplated onto structures of the MEMS device. In the case of fabrics, magnetically functional fibers 615, are incorporated with the oriented structural fibers or woven directly into the fabric, integrating the actuation directly into the overall fabric or fiber array. Additionally, other types of fibers 615 can also be incorporated into MEMS elements creating a hybrid fibrous structure with some fibers acting as integrated sensor elements. Sensing can be particularly critical in optical switching applications. For example, the torsional braid 620 can be constructed with a piezoelectric core 1510 as seen in FIG. 15, or by incorporating one or more fibers with piezoelectric properties in the braid. Braid 620 is then used to actively sense the angular deflection of the mirror.

Fabrication methods for said torsional scanners utilizes techniques from semiconductor manufacturing and existing MEMS processing and may be similar to that described earlier.

One fabrication process for said fibrous MEMS devices and scanners involves aligning fiber arrays or fabrics onto the surface of an oxidized silicon wafer and impregnating the fibers with a suitable matrix material. The matrix material may be selectively cured in certain areas to provide varying degrees of stiffness in different parts of the scanner devices. For example laser energy may be used to slectively cure the structure making up the mirror and torsional elements to a greater extent to enhance their stiffness.

Localized curing of the matrix allows the tailoring of stiffness and strength. In the scanner, the mirror element must be extremely stiff to avoid dynamic deformation during scanning. However, the torsional beams must only be stiff enough for the high frequency operation—any additional stiffness increases the power requirements. To address these disparate requirements, the matrix is selectively cured in different parts of the scanner. In one embodiment, both a pulsed 1064 nm Nd:YAG laser and a pulsed 308 nm XeCl excimer laser are used to selectively cure the mirror element and supporting structures. The cure is adjusted for the torsional elements. A pulsed laser (30 ns) will thermally affect only the irradiated area; heat diffusion is almost purely one-dimensional in this time regime. Fluences of 100 mJ/cm$^2$ are adequate with 5-10 pulses per area. Under these conditions, a conventional excimer laser (50 W) can treat a 200 mm wafer area in well under a minute. In this way, a scanner device is produced where the mirror element has very high stiffness (modulus>150 GPa) while the torsion bars are elastic to undergo large shear deformations, but sufficiently stiff to resonate at high frequencies.

Figure 16:
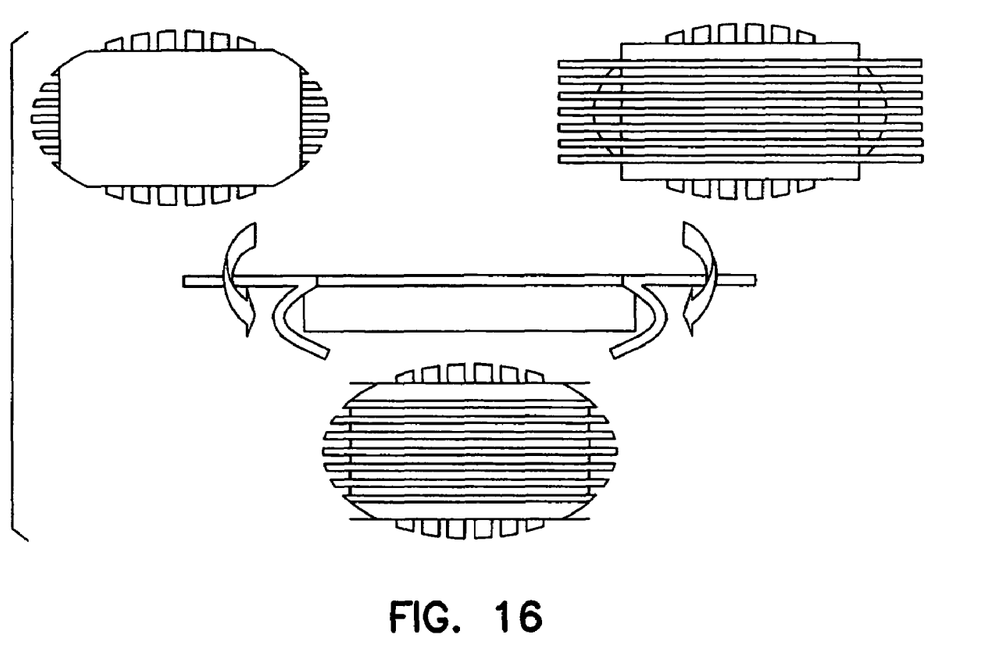
FIG. 16 illustrates pre-etching of slots in a substrate to align fiber braids during the process of forming the scanner of FIG. 14.

The torsional element braids in the fabric are aligned precisely to ensure that they are totally contained within the lithographically defined regions in one embodiment. The torsion beams are maintained defect free, and it is important to avoid or at least minimize any etching of the outer elements of the braids. In one embodiment, a pre-etching of alignment slots in the silicon substrate is performed as shown in FIG. 16. The thicker braided yarns (which will form the torsion beams) are separated from the other fine-diameter fibers and then captured in the slots. This then aligns the oriented fibers, or fabric to the substrate.

Carbon fibers etch well in oxygen and other plasmas used in conventional MEMS and IC processing. The matrix and fibers used may also be etched out in similar plasmas such as $CF_4/H_2/O_2$ or $Cl_2$ and argon. Elements of the silicon wafer are etched using standard wet etching chemistries.

A single axis scanner may also be fabricated incorporating the torsional braid and fabric mirror element in the same manner as the dual axis scanner

CONCLUSION

Fibrous micro-composite materials are formed from micro fibers. The fibrous micro-composite materials are utilized as the basis for a new class of MEMS. In addition to simple fiber composites and microlaminates, fibrous hollow and/or solid braids, can be used in structures where motion and restoring forces result from deflections involving torsion, plate bending and tensioned string or membrane motion. In some embodiments, these materials will enable simultaneous high operating frequencies, large amplitude displacements and or rotations, high reliability under cyclical stresses.

In one embodiment, fibrous elements are formed using high strength, micron and smaller scale fibers, such as carbon/graphite fibers, carbon nanotubes, fibrous single or multi-ply graphene sheets, or other materials having similar structural configurations. The type of fiber used may vary greatly. Some examples in addition to carbon fibers (and their penultimate carbon nanotubes), include but are not limited to glass fibers, Kevlar fibers, metal fibers (magnetic or electrically conductive), etc.

One MEMS device formed using the micro-composite materials is an optical scanner. The optical scanner has a mirror that is sufficiently stiff to resonate at high frequencies-approaching and eventually exceeding 10 kHz, and is tough enough to undergo large elastic deformations in either bending or torsion so as to actuate the mirror element through angular deflections approaching 40°. Fiber properties, fiber volume fraction, fiber orientation, resin materials and the fiber/resin interface characteristics can all be adjusted to modify the properties of the scanner. Scanners may be optimized for stiffness and elasticity by combining the stiffness and strength of one material with the elasticity of another.

The fibrous MEMS materials technology is also compatible with CMOS processing, which enables full system development with active control and sense circuitry on associated wafers. The anticipated commercial benefits of the use of fibrous based materials for MEMS devices are far and wide reaching.

One of the largest commercial markets for high speed/large deflection MEMS—as envisioned today—is the optical imaging and Telecommunication spaces, specifically scanners and optical switches. Raster scanned displays could be substantially miniaturized as current performance limitations are addressed, and the inherent size and mass producible nature of MEMS scanners also allows for a dramatic reduction in the cost and power consumption of these systems. Fibrous micro-composite MEMS scanners may be used in video display applications, optical cross connects for telecommunications networks, spatial light modulators, laser printer and optical data storage heads, barcode scanners etc. A myriad of other broad and niche applications exist for high performance scanners, such as endoscopic and confocal microscopes or spatial light modulators for use in laser printers, barcode scanners and optical storage heads. The small size and weight, low power consumption and low cost of the MEMS scanners also translate to the same advantages in the micro display markets.

The invention claimed is:

1. A micro-electrical-mechanical system comprising:
a substrate;
a carbon fiber and having a first longitudinal portion supported by the substrate and a second longitudinal portion free to move relative to the substrate;
a structure, mechanically coupled to the second longitudinal portion of the carbon fiber in a manner that supports the structure and causes separate movement of the structure from the substrate, wherein the substrate comprises silicon.

2. A micro-electrical-mechanical system comprising:
a substrate;
a carbon fiber and having a first longitudinal portion supported by the substrate and a second longitudinal portion free to move relative to the substrate;
a structure, mechanically coupled to the second longitudinal portion of the carbon fiber in a manner that supports the structure and causes separate movement of the structure from the substrate, wherein the substrate comprises a semiconductor.

3. A micro-electrical-mechanical system comprising:
a substrate;
a fiber having a length and width, and having a first length of the fiber supported by the substrate and a second length of the fiber free to move relative to the substrate;
a structure, mechanically coupled to the second length of the fiber in a manner that supports the structure and causes separate movement of the structure from the substrate, wherein the fiber comprises a carbon fiber and the carbon fiber includes at least one of graphite fibers, carbon nanotubes and graphene sheets.

4. A micro-electrical-mechanical system comprising:
a substrate;
a fiber having a length and width, and having a first length of the carbon fiber supported by the substrate and a second length of the carbon fiber free to move relative to the substrate;
a structure, mechanically coupled to the second length of the carbon fiber in a manner that supports the structure and causes separate movement of the structure from the substrate, wherein the substrate comprises silicon.

5. A micro-electrical-mechanical system comprising:
a substrate;
a fiber having a length and width, and having a first length of the carbon fiber supported by the substrate and a second length of the carbon fiber free to move relative to the substrate;
a structure, mechanically coupled to the second length of the carbon fiber in a manner that supports the structure and causes separate movement of the structure from the substrate, wherein the substrate comprises a semiconductor.

* * * * *